United States Patent [19]
Cheskis et al.

[11] Patent Number: 5,650,592
[45] Date of Patent: Jul. 22, 1997

[54] GRAPHITE COMPOSITES FOR ELECTRONIC PACKAGING

[75] Inventors: Harvey Cheskis, North Haven; Deepak Mahulikar, Madison, both of Conn.

[73] Assignee: Olin Corporation, New Bedford, Mass.

[21] Appl. No.: 42,913

[22] Filed: Apr. 5, 1993

[51] Int. Cl.$^6$ .................................................. H01L 23/02
[52] U.S. Cl. ........................... 174/52.4; 257/702; 361/746
[58] Field of Search ................... 174/52.4, 52.1–52.3; 257/704, 702, 709; 428/408; 361/746, 805, 820

[56] References Cited

U.S. PATENT DOCUMENTS

| | | | |
|---|---|---|---|
| 3,425,577 | 2/1969 | Fatzer et al. | 427/249 |
| 4,105,861 | 8/1978 | Hascoe et al. | 174/52.4 |
| 4,353,953 | 10/1982 | Morelock | 428/213 |
| 4,521,469 | 6/1985 | Butt | 428/35.9 |
| 4,619,741 | 10/1986 | Minten et al. | 205/125 |
| 4,659,404 | 4/1987 | Butt | 156/62.2 |
| 4,680,618 | 7/1987 | Kuroda et al. | 257/746 |
| 4,724,283 | 2/1988 | Shimada et al. | 174/257 |
| 4,743,299 | 5/1988 | Pryor et al. | 75/235 |
| 4,756,754 | 7/1988 | SinghDeo | 75/233 |
| 4,761,518 | 8/1988 | Butt et al. | 174/52.4 |
| 4,775,647 | 10/1988 | Smith, III | 501/15 |
| 4,793,967 | 12/1988 | Pryor et al. | 419/19 |
| 4,796,083 | 1/1989 | Cherukuri | 257/704 |
| 4,888,449 | 12/1989 | Crane | 174/52.4 |
| 4,913,738 | 4/1990 | Tsuuada | 75/236 |
| 4,939,316 | 7/1990 | Mahulikar | 174/52.4 |
| 4,963,414 | 10/1990 | LeVasseur et al. | 428/195 |
| 5,024,883 | 6/1991 | SinghDeo et al. | 428/323 |
| 5,043,535 | 8/1991 | Lin | 174/52.4 |
| 5,073,526 | 12/1991 | Enloe et al. | 501/96 |
| 5,102,745 | 4/1992 | Tatarchuu et al. | 428/665 |
| 5,111,277 | 5/1992 | Medeiross, III et al. | 257/720 |
| 5,163,499 | 11/1992 | Newkirk et al. | 164/98 |
| 5,182,166 | 1/1993 | Burton | 428/368 |
| 5,230,924 | 7/1993 | Li | 427/729 |
| 5,347,426 | 9/1994 | Dermarkar et al. | 361/708 |

FOREIGN PATENT DOCUMENTS 0504532  9/1992  France.

*Primary Examiner*—Bot L. Ledynh
*Attorney, Agent, or Firm*—Gregory S. Rosenblatt

[57] ABSTRACT

There is provided a component for use in electronic packaging. The component is a composite having a graphite matrix which is infiltrated with a metal or a metal alloy and the external surfaces of the composite then coated with a metallic layer to provide environmental and mechanical protection. The packaging components are lightweight, have a coefficient of thermal expansion close to that of a silicon based integrated circuit device and further, have a high coefficient of thermal conductivity.

13 Claims, 2 Drawing Sheets

GRAPHITE COMPOSITES FOR ELECTRONIC PACKAGING

BACKGROUND OF THE INVENTION

1. Field of the Invention

This invention relates to a package for housing an electronic circuit. More particularly, the invention relates to an electronic package component formed from metal infiltrated graphite.

2. Description of Related Art

Microelectronic devices are typically manufactured from a semiconductor material such as silicon, germanium or gallium/arsenide. The semiconductor material is fashioned into a die, a generally rectangular structure having circuitry formed on one surface. Along the periphery of that surface are input/output pads to facilitate electrical interconnection to external components.

The semiconductor device is brittle and requires protection from moisture and mechanical damage. This protection is provided by an electronic package. The electronic package further contains an electrically conductive means to transport electrical signals between the semiconductor device and external circuitry.

One type of electronic package has separate base and cover components defining a cavity. A leadframe is disposed between the base and cover and bonded to both by a dielectric sealant. The inner lead ends of the leadframe extend into the cavity and are electrically interconnected to one or more semiconductor devices housed within that cavity. The exterior leads of the leadframe extend beyond the electronic package perimeter for electrical interconnection to external circuitry. Typical dielectric sealing means includes sealing glasses and polymer adhesives.

One or more semiconductor devices are bonded to the package base. In selecting a material for use as a package base, weight, coefficient of thermal conductivity, and coefficient of thermal expansion are considered. The electronic package is only one component on an electronic assembly, such as a printed circuit board, which is incorporated into a device such as a computer. The weight of the device is influenced by the weight of each component. It is desirable to minimize the weight of each electronic package.

When the semiconductor device is under power, the internal electrical resistivity of the device converts a portion of the electrical signals passing through the device to heat. It is necessary to remove the generated heat to maintain efficient operation of the semiconductor device. A primary means to remove the heat is conduction through the package base. It is desirable that the base have a high coefficient of thermal conduction.

A gallium/arsenide semiconductor device has a coefficient of thermal expansion of about $6.5 \times 10^{-6}/°C$. The coefficient of thermal expansion of a silicon based device is about $3.0 \times 10^{-6}/°C$. If the package base has a coefficient of thermal expansion close to that of the semiconductor device, mounting of the semiconductor device to the base is simplified. Any one of a number of solders, polymer adhesives, or sealing glasses may be utilized. When there is a significant variation in the coefficient of thermal expansion between the semiconductor device and the package base, the mismatch causes stresses which can fracture the device. Reducing the coefficient of thermal expansion mismatch reduces the stresses on the device. To compensate for a large mismatch, either compliant polymer adhesives or buffered die attach systems are required. The compensating die attach systems add cost and complexity to the electronic package. It is therefore desirable that the semiconductor package base have a coefficient of thermal expansion approximately equal to or at least somewhat close to that of the semiconductor device.

Adhesively sealed electronic packages having plastic, ceramic or metallic base components are disclosed in U.S. Pat. Nos. 4,105,861 to Hascoe, 4,521,469 to Butt and 4,939,316 to Mahulikar. Bases formed from copper or aluminum alloys satisfy two of the three requirements described above in that they are light weight and have high coefficients of thermal conductivity. The components also have a high coefficient of thermal expansion necessitating a compliant or buffered die attach system.

Composite base materials, such as copper/molybdenum or copper/tungsten are typically formed by infiltrating a porous molybdenum or tungsten substrate with molten copper or by powder metallurgy. The use of these composites in electronic packages is disclosed in U.S. Pat. Nos. 4,680,618 to Koroda and 5,111,277 to Medeiros, III. The composites have a coefficient of thermal expansion approximately equal to that of the semiconductor device and a high coefficient of thermal conductivity. The composite materials are much heavier than components formed from copper or aluminum alloys.

Another type of composite is disclosed in U.S. Pat. No. 4,761,518 to Butt. A mixture of ceramic, glass and metal particles are pressed and sintered into a composite. By careful selection of the composition and volume percent of each of the three elements, light weight composites with a high coefficient of thermal conductivity and coefficient of thermal expansion may be developed. These materials are relatively expensive to manufacture and may have property variations from part to part.

One light weight material with a high coefficient of thermally conductivity and a coefficient of thermal expansion close to that of a silicon based semiconductor device is graphite. Graphite has excellent machinability and is relatively low cost. However, graphite is porous, nonhermetic, brittle, low strength and easily eroded. For these reasons, graphite has not been exploited for electronic package components.

Graphite has been disclosed as the core for printed circuit boards in U.S. Pat. No. 4,963,414 to LeVasseur. Metallic layers are adhesively bonded to a graphite core. The metallic layers provide strength and environmental protection to the planar faces of the graphite core. However, the edges of the graphite are exposed to the environment and subject to mechanical or chemical erosion. Further, the adhesive layer between the metallic layers and the graphite core electrically isolates the metallic layer from the graphite core and slightly increases the thermal resistance between a semiconductor device mounted on the metallic layer and the graphite core.

SUMMARY OF THE INVENTION

Accordingly, it is object of the invention to provide a graphite substrate suitable to be used as an electronic package component. It is a feature of the invention that the graphite substrate is infiltrated with a metal such as copper, aluminum or nickel. It is an advantage of the invention that the metal infiltrated graphite composites are hermetic, have a coefficient of thermal expansion close to that of a silicon based semiconductor device and have a relatively high coefficient of thermal conductivity. It is a further advantage of the invention that the copper infiltrated graphite composites are readily coatable with a second metal.

In accordance with the invention, there is provided an electronic package component. The package component comprises a graphite substrate infiltrated with a metal or metal alloy.

The above stated objects, features and advantages will become more apparent from the specification and drawings which follow.

IN THE DRAWINGS

DETAILED DESCRIPTION

Figure 1:
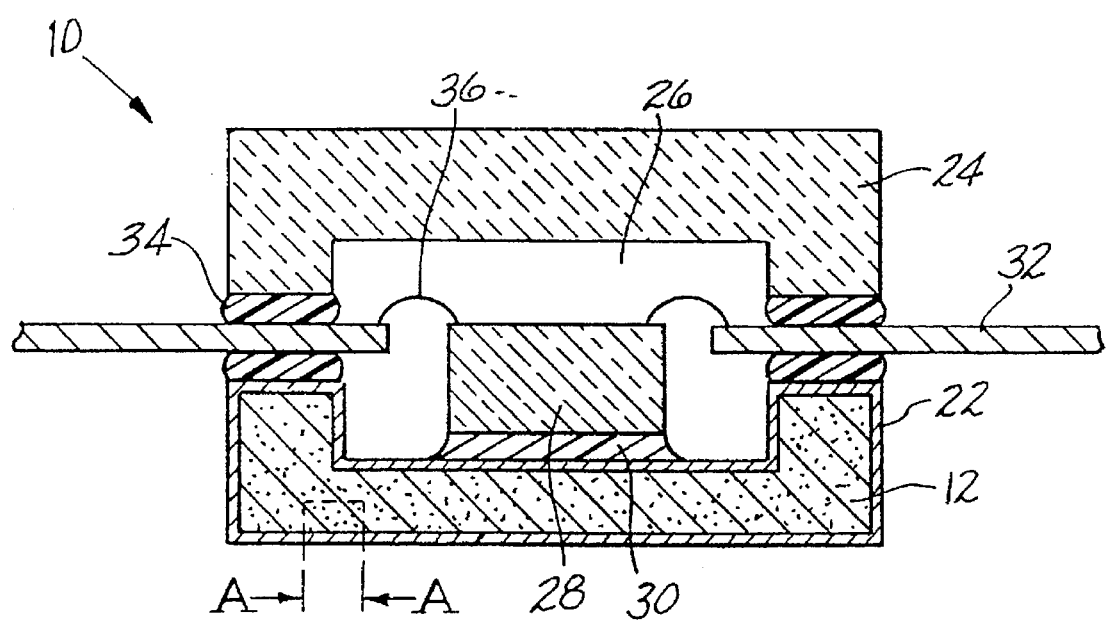
FIG. 1 illustrates in cross-sectional representation an electronic package incorporating a metal infiltrated graphite base in accordance with the invention.

FIG. 1 illustrates in cross-sectional representation an electronic package 10 having a base component 12 in accordance with the present invention. The base component 12 is a composite having a graphite matrix which is infiltrated with a metal or metal alloy.

Figure 2:
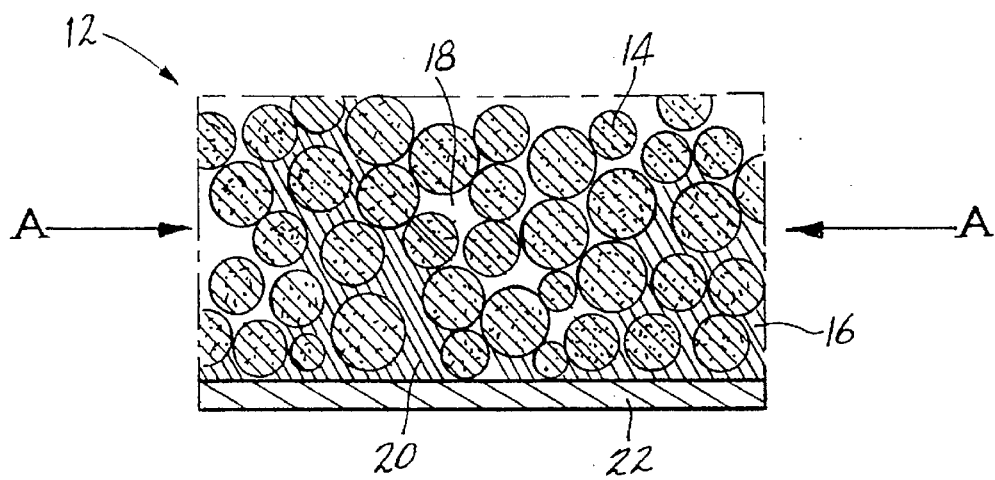
FIG. 2 illustrates in cross-sectional representation a magnified view of the metal infiltrated graphite base.

FIG. 2 illustrates in cross-sectional representation a magnified view of the section AA of the electronic base component 12 of FIG. 1. The electronic base component 12 is comprised of a graphite matrix infiltrated with a metal or metal alloy. The matrix is formed by grinding calcined coke into a powder, mixing the powder with a binder, compressing the mixture into a block and firing the block at elevated temperatures to remove volatile materials. The resultant structure is a mass of adherent graphite spheres 14. The spheres are preferably from about 1 to about 20 microns (40–800 microinches) in diameter. More preferably, the sphere diameter is from about 3 to about 8 microns (120–320 microinches). The spaces between the graphite spheres 14 are pores. Pores 16 which intercept each other and form continuous pathways to the surface constitute open porosity. Pores 18 isolated from the surface constitute closed porosity.

The fired graphite block is machined into a desired shape. Following machining, the graphite block is infiltrated with liquid metal 20. Infiltration is typically achieved by immersing the machined graphite into the liquid metal. Any metal which is molten below the pyrolyzation temperature of graphite and which does not unduly attack the graphite, may be utilized. Preferred metals include copper, aluminum, nickel, titanium and their alloys. Copper and copper alloys are particularly preferred because the copper greatly increases the thermal conductivity of the composite and is readily coated by electrolytic means. The infiltrated liquid metal 20 preferably occupies from about 10% to about 50% by weight of the composite structure. More preferably, from about 20% to about 40% by weight of the composite is metal or metal alloy.

Copper infiltrated graphite composites have been used for casting molds for copper alloys and steel. The thermal stability of graphite is enhanced by the thermal conductivity of copper. Copper infiltrated graphite is available from Poco Graphite, Inc. of Decatur, Tex.

The metal infiltrated copper composites have exposed graphite surfaces which when exposed to elevated temperatures or rough handling may be damaged. It is preferred that the surfaces of the composite material be coated with a metallic layer 22. The metallic layer 22 may be applied by any suitable process such as vapor deposition, electrolytic deposition or nonelectrolytic chemical deposition. When the infiltrating metal is copper or a copper alloy, electrical conductivity of the composite is sufficiently high that electroplating may be utilized.

The composite is activated by a process suitable for both graphite and copper. One such activation process is disclosed in U.S. Pat. No. 4,619,741 to Minten which is incorporated by reference in its entirety herein. The composite is immersed in a sodium persulfate microetch which removes the first few atomic layers of the copper without attaching the graphite. The fresh copper surface and the graphite surface are both amenable to electrolytic deposition.

The activated composite is then immersed in an electrolytic cell containing ions of the desired deposition metal. If the surface of the composite is to be solderable such that a solder die attach may be utilized, a solderable metal such as gold, silver, nickel or an alloy thereof may be deposited. If the surface of the composite is to be wettable by a nonmetal such as a solder glass or polymer die attach, then a refractory oxide forming metal such as nickel, aluminum or an alloy thereof may be deposited.

A preferred coating metal is nickel. One suitable nickel electrolyte contains:

| | |
|---|---|
| nickel sulfamate | 500 ml/l |
| boric acid | 30 g/l |
| nickel chloride | 5 g/l |

The plating parameters are a current density of 2–16 A/dm$^2$ at a pH of 3.9–4.2. The plating temperature is from 40° C.–60° C. The deposited nickel is under low stress even at high coating thicknesses. A preferred thickness for the metallic coating layer 22 is from about 5 to about 30 microns. When a noble metal such as gold forms the metallic coating layer, thinner coatings, from about 2 to about 20 microns are employed.

Other metallic coating materials, such as those disclosed in U.S. Pat. No. 4,888,449 to Crane et al, which is incorporated by reference in its entirety herein, may also be utilized. These coatings are capable of forming a refractory oxide layer to enhance the bonding of a dielectric adhesive. These materials include aluminum, nickel, tin, cobalt and alloys thereof.

In addition, nonmetallic coatings such as polymers or sealing glasses may also be utilized to coat the surface of the composite. For example, the composite may be immersed in a molten solder glass to deposit a dielectric coating on the surface.

With reference back to FIG. 1, the electronic package 10 has a metal infiltrated graphite composite base 12 coated with a metallic layer 22. A cover component 24 in combination with the base component 12 defines a cavity 26. Disposed within the cavity 26 is one or more integrated circuit devices 28. The integrated circuit devices 28 are bonded to the base 12 by a die attach 30. The die attach 30 is any suitable polymer, sealing glass or solder. Because the coefficient of thermal expansion of the metal infiltrated graphite composite is close to that of a silicon based integrated circuit device 28, a wide variety of die attach materials may be used. The die attach is not limited to compliant polymers and buffered die attach systems.

If a solder die attach is used, for example, a lead tin alloy or a gold tin alloy, the metallic layer 22 is preferably selected to be a material readily wet by that metallic solder. For example, a gold-tin alloy solder would readily wet a gold metallic layer.

If the die attach 30 is a sealing glass or polymer, the metallic layer 22 is preferably one which forms a refractory oxide such as nickel or aluminum. Nickel is the preferred material because of the ease of deposition and the ability to form a tenacious nickel oxide.

The leadframe 32 is formed from copper or a copper alloy to maximize electrical conductivity. Alternatively, the leadframe is formed from an iron-nickel alloy to closer match the coefficient of thermal expansion of the metal infiltrated graphite composite.

The cover component 24 may be formed from any suitable material, including metals, plastics and ceramics. The cover component 24 preferably has a coefficient of thermal expansion about equal to that of the metal infiltrated graphite composite 12 to prevent flexing of the package during heating and cooling. Ceramic materials are most preferred due to their light weight and rigidity. Copper infiltrated graphite, while more expensive, may also be utilized to exactly match the thermal expansion.

The metal infiltrated graphite composite 12 and the cover 24 are bonded together with the leadframe 32 disposed there between by means of a dielectric adhesive 34. The dielectric adhesive 34 may be any suitable polymer or sealing glass. Suitable polymers include thermosetting epoxies. Suitable sealing glasses are those having a coefficient of thermal expansion approximately matching that of the base and cover components. The coefficient of thermal expansion of the sealing glass may be adjusted by the addition of an appropriate filler such as calcium fluoride as disclosed in U.S. Pat. No. 4,775,647 to Smith, III. Prior to sealing of the package, the semiconductor device 28 is electrically interconnected to the leadframe 32 by means of bond wires 36. Rather than bond wires, thin strips of copper foil as utilized in tape automated bonding (TAB) may also be utilized.

Figure 3:
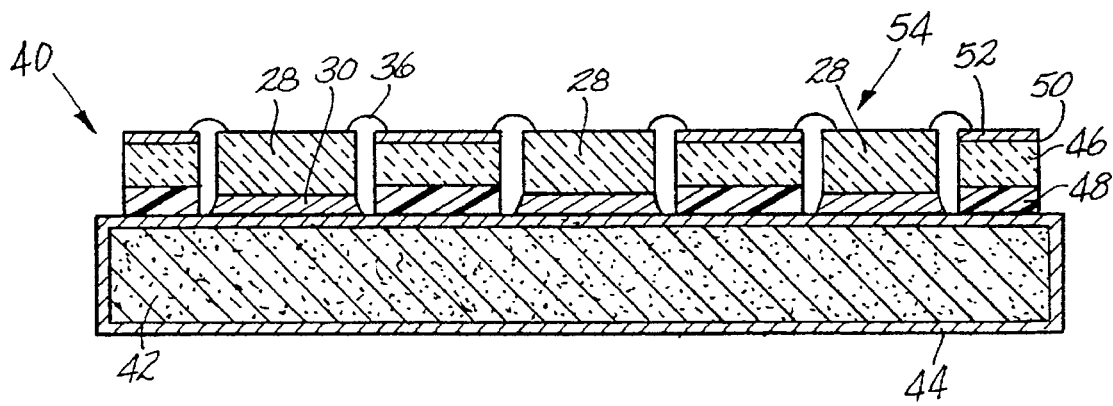
FIG. 3 illustrates in cross-sectional representation a multichip module having a metal infiltrated graphite base.

FIG. 3 illustrates in cross-sectional representation a multi-chip module 40 in accordance with an embodiment of the invention. The multi-chip module base 42 is formed from metal infiltrated graphite and is similar to that illustrated in FIG. 2. A metallic layer 44, as described above, preferably coats the base 42. A plurality of semiconductor devices 28 are bonded to the surface of the base 42 by a suitable die attach. A nonconductive substrate 46 such as a polymer film or a ceramic is bonded to the multi-chip module base 42. The bonding means 48 may be a suitable polymer adhesive such as a thermosetting epoxy. If the nonconductive layer 46 has been metallized, a solder such as a lead-tin alloy may be utilized. The outermost surface 50 of the nonconductive substrate 46 is metallized into a plurality of circuit patterns 52 which are electrically interconnected to the integrated circuit device 28 by bond wires 36. Apertures 54 may be formed in the nonconductive substrate 46 for direct bonding of the integrated circuit devices 28 to the metal infiltrated graphite substrate 42. Alternatively, the integrated circuit devices 28 may be bonded to the nonconductive substrate.

Suitable nonconductive substrates include ceramics such as alumina, aluminum nitride and beryllium oxide, as well as polymers such as polyimide and fiber reinforced epoxy. The entire multi-chip module 40 may then be encased in a hybrid package or other suitable electronic packaging means.

The advantages of the present invention will become more apparent from the example which follows.

EXAMPLE

The density, coefficient of thermal expansion and coefficient of thermal conduction of various electronic packaging materials were evaluated. The optimum materials would have a minimum density, coefficient of thermal expansion close to that of a silicon based semiconductor device ($3 \times 10^{-6}$°C.) and a maximum coefficient of thermal conductivity. As indicated in Table 1, copper infiltrated graphite in accordance with the present invention, is a superior material.

TABLE 1

| Composition | Density grams per square centimeter | Coefficient of Thermal Expansion ($\times 10^{-6}$°C.) | Coefficient of Thermal Conductivity (W/m°K.) |
| --- | --- | --- | --- |
| Copper | 8.92 | 16.6 | 398 |
| Aluminum | 2.70 | 25 | 237 |
| 15% Copper/Tungsten Composite | 17.79 | 6.3 | 211 |
| 20% Copper/balance Molybdenum composite | 9.94 | 7.3 | 192 |
| 25% Al$_2$O$_3$, 25% PbSiO$_3$, balance Copper | 7.07 | 11.23 | 209 |
| 40% by weight Copper infiltrated in graphite | 3.05 | 8.6 | 175 |
| 10% Tungsten infiltrated in graphite | 1.95 | 7.7 | 130 |

While the metal infiltrated graphite substrates are particularly drawn to electronic packaging components, they are equally suitable for other electronic applications such as printed circuit boards.

It is apparent that there has been provided in accordance with this invention, a metal infiltrated graphite composite suitable as an electronic package component which fully satisfies the objects, features and advantages described hereinabove. While the invention has been described in connection with embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. An electronic package, comprising:
   a base formed from a metal infiltrated graphite composite, said base being hermetic and free of open pores and coated with a metallic layer;
   a cover;
   a leadframe disposed between said base and said cover; and
   a dielectric sealant bonding said base to said cover with said leadframe disposed therebetween.

2. The electronic package of claim 1 wherein said metallic layer is solderable.

3. The electronic package of claim 2 wherein said metallic layer is selected from the group consisting of gold, silver, nickel and alloys thereof.

4. The electronic package of claim 3 wherein said metallic layer is gold having a thickness of from about 2 to about 20 microns.

5. The electronic package of claim 1 wherein said metallic layer is capable of forming a refractory oxide.

6. The electronic package of claim 5 wherein said metallic layer is selected from the group consisting of nickel, aluminum and alloys thereof.

7. The electronic package of claim 6 wherein said metallic layer is nickel having a thickness of from about 5 to about 30 microns.

8. The electronic package of claim 7 wherein said dielectric sealant is selected from the group consisting of polymer adhesives and sealing glasses.

9. The electronic package of claim 8 wherein said sealant is a thermosetting epoxy.

10. The electronic package of claim 8 wherein said cover is selected to have a coefficient of thermal expansion approximately equal to the coefficient of thermal expansion of said base.

11. The electronic package of claim 10 wherein said cover is selected to be alumina.

12. A substrate for a multi-chip module, comprising:
   a base formed from a metal infiltrated graphite composite, said base being hermetic and free of open pores and coated with a metallic layer;
   a nonconductive layer having first and second sides and at least one aperture, said first side bonded to said base;
   a pattern of circuit traces formed on said second side of said nonconductive layer; and
   one or more integrated circuit devices bonded to said base and extending through said at least one aperture and electrically interconnected to said pattern of circuit traces.

13. The electronic package of claim 1 wherein said base is formed from an aluminum or an aluminum alloy infiltrated graphite composite.

* * * * *